(12) United States Patent
Vahey et al.

(10) Patent No.: US 10,749,618 B1
(45) Date of Patent: Aug. 18, 2020

(54) METHODS OF CLOSED-LOOP CONTROL OF A RADIO FREQUENCY (RF) TEST ENVIRONMENT BASED ON MACHINE LEARNING

(71) Applicant: Raytheon Company, Waltham, MA (US)

(72) Inventors: Scott W. Vahey, Goleta, CA (US); Aubrey J. Russell, Santa Barbara, CA (US)

(73) Assignee: Raytheon Company, Waltham, MA (US)

( * ) Notice: Subject to any disclaimer, the term of this patent is extended or adjusted under 35 U.S.C. 154(b) by 0 days.

(21) Appl. No.: 16/660,325

(22) Filed: Oct. 22, 2019

(51) Int. Cl.
*H04B 17/26* (2015.01)
*H04B 17/29* (2015.01)
*G06N 5/02* (2006.01)
*G06N 20/00* (2019.01)
*H04B 17/00* (2015.01)

(52) U.S. Cl.
CPC .............. *H04B 17/29* (2015.01); *G06N 5/025* (2013.01); *G06N 20/00* (2019.01); *H04B 17/0085* (2013.01); *H04B 17/26* (2015.01)

(58) Field of Classification Search
CPC .... H04B 17/00; H04B 17/0085; H04B 17/20; H04B 17/24; H04B 17/26; H04B 17/29; H04B 17/30; H04B 17/309; G06N 20/00; G06N 5/025
See application file for complete search history.

(56) References Cited

U.S. PATENT DOCUMENTS

| | | | | |
|---|---|---|---|---|
| 2012/0049873 | A1* | 3/2012 | Bourstein | G01R 31/3004 324/750.01 |
| 2012/0112783 | A1* | 5/2012 | Ishida | G01R 31/31721 324/762.02 |
| 2012/0233511 | A1* | 9/2012 | Kim | G01R 31/31854 714/726 |
| 2014/0253162 | A1* | 9/2014 | Wang | G01R 31/2889 324/754.08 |
| 2016/0011232 | A1* | 1/2016 | Marques Martins | G01R 31/31905 324/754.03 |

* cited by examiner

*Primary Examiner* — Siu M Lee
(74) *Attorney, Agent, or Firm* — Schwegman Lundberg & Woessner, P.A.

(57) ABSTRACT

Embodiments of a controller device and methods of control for a radio frequency (RF) test environment are generally described herein. The RF test environment may include the controller device, an RF generator, and a device under test (DUT). The DUT may be configurable to switch between multiple configurations. The controller device may receive feedback from the DUT that indicates a current configuration of the DUT. The controller device may use a machine learning rule to determine a set of candidate future configurations of the DUT based on the current configuration of the DUT. The controller device may generate a set of RF waveforms corresponding to the set of candidate future configurations of the DUT, and may transfer the set of RF waveforms to the RF generator.

19 Claims, 7 Drawing Sheets

FIG. 7

METHODS OF CLOSED-LOOP CONTROL OF A RADIO FREQUENCY (RF) TEST ENVIRONMENT BASED ON MACHINE LEARNING

TECHNICAL FIELD

Some embodiments pertain to machine learning. Some embodiments pertain to radio frequency (RF) test environments. Some embodiments pertain to RF test environments that include a device under test (DUT). Some embodiments pertain to usage of machine learning related to control of an RF test environment.

BACKGROUND

In some systems, radio frequency (RF) testing may be performed in a setup that includes components such as an RF generator and a device under test (DUT). In order to emulate real-word testing of the DUT, a number of different RF waveforms may be used by the RF generator. In such testing, latency requirements related to switching between RF waveforms may be challenging, in some cases.

DETAILED DESCRIPTION

The following description and the drawings sufficiently illustrate specific embodiments to enable those skilled in the art to practice them. Other embodiments may incorporate structural, logical, electrical, process, and other changes. Portions and features of some embodiments may be included in, or substituted for, those of other embodiments. Embodiments set forth in the claims encompass all available equivalents of those claims.

Figure 1:
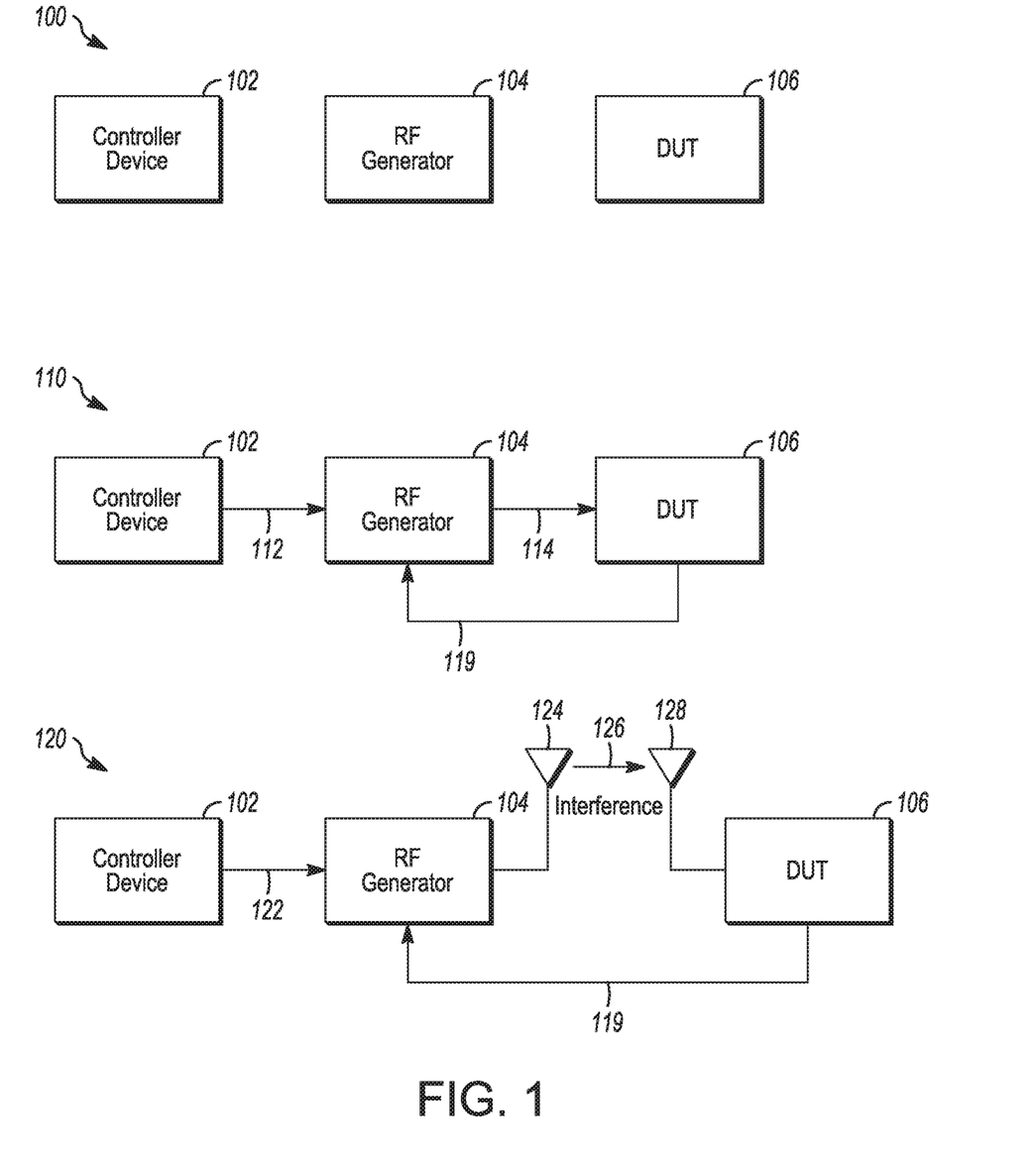
FIG. 1 illustrates an example system and example scenarios in accordance with some embodiments.

FIG. 1 illustrates an example system 100 and example scenarios 110, 120 in accordance with some embodiments. Embodiments are not limited to the name, number, type, arrangement and/or other aspects of the components shown in FIG. 1. The scenarios 110 and 120 illustrate non-limiting example scenarios. It is understood that embodiments are not limited to these scenarios, as other scenarios are possible. In some embodiments, one or more of the techniques, operations, and/or methods described herein may be applicable to the scenario 110, the scenario 120 and/or other scenarios. Although some techniques, operations and/or methods may be described herein in terms of one of the scenarios 110, 120, the scope of embodiments is not limited to the scenarios 110, 120, as one or more of those techniques, operations and/or methods may be applicable to other scenarios.

The system 100 may include a controller device 102, a radio frequency (RF) generator 104, and a device under test (DUT) 106.

Example DUTs 106 may include, but are not limited to, a radar warning receiver (RWR), electronic intelligence (ELINT) device, a communication device, a radar device, or any device for which one or more tests are performed.

Examples of test equipment setup goals, and/or test setup performance metrics may include, but are not limited to: the number of pulses per second that can be generated, power, time accuracy, phase accuracy, a number of simulated active emitters, the number of antennas on the DUT 106 capable of being driven, the number of simultaneous RF signals supported, and/or other(s). The goals, test metrics, and/or performance metrics related test result measurements may include, but are not limited to: ID accuracy, response accuracy, and/or other(s). In addition, the goals, test metrics, and/or performance metrics described above may be related to the DUT 106, the RF generator 104 and/or other component(s), although the scope of embodiments is not limited in this respect.

It is understood that some embodiments may not necessarily include all components of the system 100 shown in FIG. 1. Some embodiments may include one or more additional components not shown in FIG. 1. Some embodiments of the system 100 may include one or more alternate components in place of one or more of the components shown in 100 in FIG. 1. In some embodiments, a device other than the controller device 102 may perform one or more of the techniques, operations and/or methods described herein, in some embodiments.

Different arrangements are possible in terms of communication between components 102, 104, 106. Communication between the components 102, 104, 106 may include wireless connectivity and/or wired connectivity. In some embodiments, one or more of the following may be applicable: the controller device 102 and the RF generator 104 may communicate in accordance with wired connectivity; the controller device 102 and the DUT 106 may communicate in accordance with wired connectivity; the RF generator 104 and the DUT 106 may communicate in accordance with wired connectivity; and/or other.

In the scenario 110, the controller device 102 may communicate with the RF generator 104, such as over a wired connection 112 and/or other. The RF generator 104 may communicate with the DUT 106, such as over a wired connection 114 and/or other. The DUT 106 may communicate with the RF Generator 104, such as over a wired connection 119 and/or other. In some embodiments, the DUT 106 may receive a signal. In some embodiments, the DUT 106 may receive a signal over a wired RF connection. In some embodiments, the DUT 106 may transmit a signal over a wired RF connection based upon input from the Controller Device 102 and the DUT 119. In some embodiments, the RF generator 104 may provide a source signal to the DUT 106, and the DUT 106 may transmit a signal that is based on the source signal.

In the scenario 120, the controller device 102 may communicate with the RF generator 104, such as over a wired connection 122 and/or other. The DUT 106 may communicate with the RF Generator 104, such as over a wired connection 119 and/or other. The RF generator 104 may transmit signals using the antenna 124. The DUT 106 may receive signals using the antenna 128. As indicated by 126, the signal from the antenna 124 of the RF generator 104 may be any describable signal, including interference, to the DUT 106. The scope of embodiments is not limited in this respect, however, as the RF generator 104 may transmit signals (that are not necessarily interference) wirelessly to the DUT 106, in some embodiments.

As used herein, the term "circuitry" may refer to, be part of, or include an Application Specific Integrated Circuit (ASIC), an electronic circuit, a processor (shared, dedicated, or group), and/or memory (shared, dedicated, or group) that execute one or more software or firmware programs, a combinational logic circuit, and/or other suitable hardware components that provide the described functionality. In some embodiments, the circuitry may be implemented in, or functions associated with the circuitry may be implemented by, one or more software or firmware modules. In some embodiments, circuitry may include logic, at least partially operable in hardware. Embodiments described herein may be implemented into a system using any suitably configured hardware and/or software.

Figure 2:
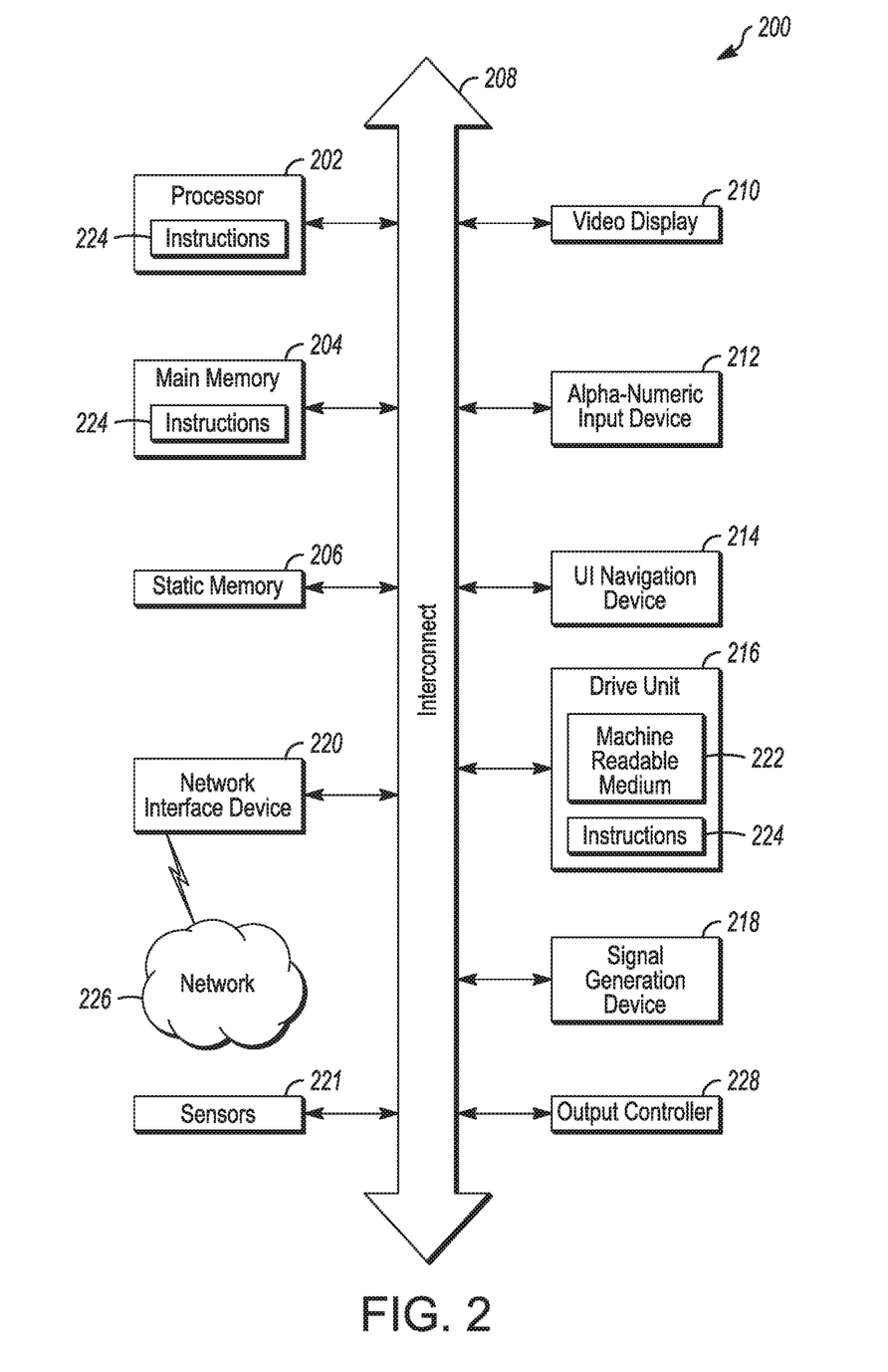
FIG. 2 illustrates a block diagram of an example machine in accordance with some embodiments.

FIG. 2 illustrates a block diagram of an example machine in accordance with some embodiments. In some embodiments, the controller device 102 and/or other device may include one or more components shown in FIG. 2. For instance, the machine readable medium 222 may be used to implement one or more operations of the controller device 102 and/or other device, in some cases. In some embodiments, the machine 200 may be a device that includes the controller device 102. As an example, the controller device 102, an airborne device, an aircraft, a missile and/or other device may perform communication operations and/or other operations using one or more components from FIG. 2. In some embodiments, the machine 200 or one or more components of the machine 200 may be configurable to transmit elements such as packets, numbers, values, fields, compressed numbers and/or other.

Any one or more of the techniques (e.g., methodologies) discussed herein may be performed on such a machine 200, in some embodiments. In alternative embodiments, the machine 200 may operate as a standalone device or may be connected (e.g., networked) to other machines. In a networked deployment, the machine 200 may operate in the capacity of a server machine, a client machine, or both in server-client network environments. In an example, the machine 200 may act as a peer machine in peer-to-peer (P2P) (or other distributed) network environment. In some embodiments, the machine 200 may be a controller device (such as 102 and/or other), RF generator (such as 104 and/or other), DUT (such as 106 and/or other), a radar warning receiver (RWR), electronic intelligence (ELINT) device, a communication device, a radar device, a personal computer (PC), a tablet PC, a set-top box (STB), a personal digital assistant (PDA), or any machine capable of executing instructions (sequential or otherwise) that specify actions to be taken by that machine. Further, while only a single machine is illustrated, the term "machine" shall also be taken to include any collection of machines that individually or jointly execute a set (or multiple sets) of instructions to perform any one or more of the methodologies discussed herein, such as cloud computing, software as a service (SaaS), other computer cluster configurations.

Examples, as described herein, may include, or may operate on, logic or a number of components, modules, or mechanisms. Modules are tangible entities (e.g., hardware) capable of performing specified operations and may be configured or arranged in a certain manner. In an example, circuits may be arranged (e.g., internally or with respect to external entities such as other circuits) in a specified manner as a module. In an example, the whole or part of one or more computer systems (e.g., a standalone, client or server computer system) or one or more hardware processors may be configured by firmware or software (e.g., instructions, an application portion, or an application) as a module that operates to perform specified operations. In an example, the software may reside on a machine readable medium. In an example, the software, when executed by the underlying hardware of the module, causes the hardware to perform the specified operations.

As a non-limiting example, a module may include a group of components connected to (permanently, temporarily and/or semi-permanently) a circuit board, processor board and/or other medium.

Machine (e.g., computer system) 200 may include a hardware processor 202 (e.g., a central processing unit (CPU), a graphics processing unit (GPU), a hardware processor core, or any combination thereof), a main memory 204 and a static memory 206, some or all of which may communicate with each other via an interlink (e.g., bus) 208. In some embodiments, components of the machine 200 may communicate with each other via optical interfaces, waveguides and/or other circuitry configured to exchange optical signals. In some embodiments, the interconnect 208 may be configured to communicate optical signals and/or other signals between components of the machine 200.

The machine 200 may further include a display unit 210, an alphanumeric input device 212 (e.g., a keyboard), and a user interface (UI) navigation device 214 (e.g., a mouse). In an example, the display unit 210, input device 212 and UI navigation device 214 may be a touch screen display. The machine 200 may additionally include a storage device (e.g., drive unit) 216, a signal generation device 218 (e.g., a speaker), a network interface device 220, and one or more sensors 221, such as a global positioning system (GPS) sensor, compass, accelerometer, or other sensor. The machine 200 may include an output controller 228, such as a serial (e.g., universal serial bus (USB), parallel, or other wired or wireless (e.g., infrared (IR), near field communication (NFC), etc.) connection to communicate or control one or more peripheral devices (e.g., a printer, card reader, etc.).

The storage device 216 may include a machine readable medium 222 on which is stored one or more sets of data structures or instructions 224 (e.g., software) embodying or utilized by any one or more of the techniques or functions described herein. The instructions 224 may also reside, completely or at least partially, within the main memory 204, within static memory 206, or within the hardware processor 202 during execution thereof by the machine 200. In an example, one or any combination of the hardware processor 202, the main memory 204, the static memory 206, or the storage device 216 may constitute machine readable media.

While the machine readable medium 222 is illustrated as a single medium, the term "machine readable medium" may include a single medium or multiple media (e.g., a centralized or distributed database, and/or associated caches and servers) configured to store the one or more instructions 224.

The term "machine readable medium" may include any medium that is capable of storing, encoding, or carrying instructions for execution by the machine 200 and that cause the machine 200 to perform any one or more of the techniques of the present disclosure, or that is capable of storing, encoding or carrying data structures used by or associated with such instructions. Non-limiting machine readable medium examples may include solid-state memories, and optical and magnetic media. Specific examples of machine readable media may include: non-volatile memory, such as semiconductor memory devices (e.g., Electrically Programmable Read-Only Memory (EPROM), Electrically Erasable Programmable Read-Only Memory (EEPROM)) and flash memory devices; magnetic disks, such as internal hard disks and removable disks; magneto-optical disks; Random Access Memory (RAM); and CD-ROM and DVD-ROM disks. In some examples, machine readable media may include non-transitory machine readable media. In some examples, machine readable media may include machine readable media that is not a transitory propagating signal. In some embodiments, a machine readable medium may be a non-transitory computer-readable storage medium. In some embodiments, a machine readable medium may be a computer-readable storage medium.

The instructions 224 may further be transmitted or received over a communications network 226 using a transmission medium via the network interface device 220 utilizing any one of a number of transfer protocols. Example communication networks may include a local area network (LAN), a wide area network (WAN), a packet data network (e.g., the Internet), among others. The term "transmission medium" shall be taken to include any intangible medium that is capable of storing, encoding or carrying instructions for execution by the machine 200, and includes digital or analog communications signals or other intangible medium to facilitate communication of such software.

Although the controller device 102 and machine 200 may be illustrated as having several separate functional elements, one or more of the functional elements may be combined and may be implemented by combinations of software-configured elements, such as processing elements including digital signal processors (DSPs), and/or other hardware elements. For example, some elements may comprise one or more microprocessors, DSPs, field-programmable gate arrays (FPGAs), application specific integrated circuits (ASICs), radio-frequency integrated circuits (RFICs) and combinations of various hardware and logic circuitry for performing at least the functions described herein. In some embodiments, the functional elements may refer to one or more processes operating on one or more processing elements. Embodiments may be implemented in one or a combination of hardware, firmware and software. Embodiments may also be implemented as instructions stored on a computer-readable storage device, which may be read and executed by at least one processor to perform the operations described herein. A computer-readable storage device may include any non-transitory mechanism for storing information in a form readable by a machine (e.g., a computer). For example, a computer-readable storage device may include read-only memory (ROM), random-access memory (RAM), magnetic disk storage media, optical storage media, flash-memory devices, and other storage devices and media. Some embodiments may include one or more processors and may be configured with instructions stored on a computer-readable storage device.

It should be noted that in some embodiments, an apparatus of a controller device 102 may include various components of the example machine 200 shown in FIG. 2 and/or other component(s). Accordingly, in some cases, techniques and operations described herein that refer to the controller device 102 may be applicable to an apparatus of a controller device.

In accordance with some embodiments, the controller device 102 may perform control functionality for a system that includes a radio frequency (RF) generator and a DUT 106. The RF generator 104 may be configured to provide a source signal to the DUT 106 to enable transmission by the DUT 106. The DUT 106 may be configurable to switch between receive configurations of a plurality of receive configurations. The controller device 102 may generate a machine learning rule for prediction of future receive configurations of the DUT. The machine learning rule may be generated based on historical data related to a sequence of receive configurations of the DUT 106 at a sequence of times. The controller device 102 may receive, from the DUT 106, feedback that indicates a current receive configuration of the DUT 106. The controller device 102 may apply the machine learning rule to the current receive configuration of the DUT 106 to determine a set of candidate future receive configurations of the DUT 106 during a future time period. The controller device 102 may generate a set of RF waveforms that includes an RF waveform for each of the candidate future receive configurations of the DUT 106. Each RF waveform may be generated based on one or more RF parameters of the corresponding candidate future receive configuration of the DUT 106. The controller device 102 may transfer the set of RF waveforms to the RF generator 104. These embodiments are described in more detail below.

Figure 3:
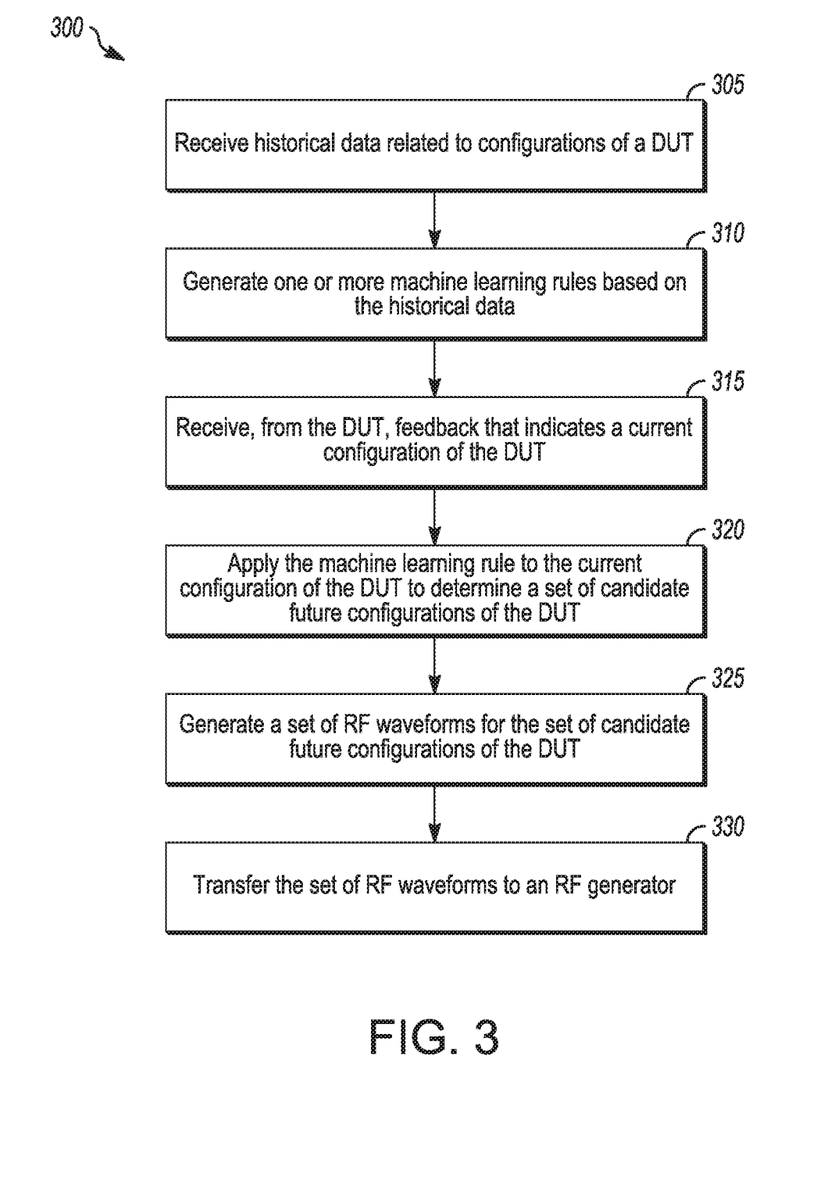
FIG. 3 illustrates the operation of a method in accordance with some embodiments.

FIG. 3 illustrates the operation of an example method in accordance with some embodiments. In some embodiments, the method 300 may be performed by the controller device 102, although the scope of embodiments is not limited in this respect. The method 300 may be performed by other devices and/or components in some embodiments. In some embodiments, operations of the method 300 may be performed by one or more components, including but not limited to one or more of the components of the machine 200 shown in FIG. 2. Those components may be included in the controller device 102 in some embodiments, although the scope of embodiments is not limited in this respect. In descriptions herein of techniques and/or operations, references may be made to components of the controller device 102, but such references are not limiting. The techniques and/or operations may be performed by other components (such as components shown in and/or described by any of FIGS. 1-7) which may or may not necessarily be included in a controller device 102, in some embodiments.

In some embodiments, a component and/or an apparatus of the component (wherein the component may be the controller device 102, the RF generator 104, the DUT 106, and/or other) may perform one or more operations that may be the same as, similar to, reciprocal to and/or related to one or more of the operations of the method 300. In some embodiments, a component and/or an apparatus of the component (wherein the component may be the controller device 102, the RF generator 104, the DUT 106, and/or other) may perform one or more operations that may be the same as, similar to, reciprocal to and/or related to one or more operations described herein.

It is important to note that embodiments of the method 300 may include additional or even fewer operations or processes in comparison to what is illustrated in FIG. 3. In addition, embodiments of the method 300 are not necessarily limited to the chronological order that is shown in FIG. 3. In describing the method 300, reference may be made to one or more of FIGS. 1-7, although it is understood that the method 300 may be practiced with any other suitable systems, interfaces and components.

It should also be noted that the method 300 may be applicable to an apparatus for a controller device (such as 102 and/or other), in some embodiments. For instance, an apparatus of the controller device 102 may perform one or more operations of the method 300 and/or other operations described herein, in some embodiments. In some embodiments, the controller device 102 (and/or components of the controller device 102) may operate as part of a system such as a computing device, computer, switch, router, mobile device and/or other device. Embodiments are not limited to these examples, however.

In some embodiments, the controller device 102 may perform control functionality for a system that includes an RF generator 104 and a DUT 106. Embodiments are not limited to this system, however, as one or more of the techniques, operations and/or methods described herein may be applicable to other systems, in some embodiments.

At operation 305, the controller device 102 may receive data. At operation 310, the controller device 102 may generate one or more machine learning rules. At operation 315, the controller device 102 may receive feedback from the DUT 106. At operation 320, the controller device 102 may apply the one or more machine learning rules. At operation 325, the controller device 102 may generate a set of RF waveforms for the set of candidate future configurations of the DUT 106. At operation 330, the controller device 102 may transfer the set of RF waveforms to an RF generator 104.

In some embodiments, the RF generator 104 may be configured to provide a source signal to the DUT 106 to enable reception by the DUT 106. The DUT 106 may be configurable to switch between receive configurations of a plurality of receive configurations. Embodiments are not limited to receive configurations, however, as one or more of the techniques, operations and/or methods described herein may be applicable to transmit configurations and/or other configurations, in some embodiments.

In some embodiments, the RF generator 104 may be configured to generate/provide an interference signal. The interference signal may be transmitted by the RF generator and may affect the DUT 106. The DUT 106 may be configurable to switch between configurations of a plurality of configurations (wherein the configurations may be receive configurations, transmit configurations and/or other configurations), although the scope of embodiments is not limited in this respect.

At operation 305, the controller device 102 may receive data. In some embodiments, the controller device 102 may receive historical data. In some embodiments, the controller device 102 may receive the historical data from the DUT 106. In some embodiments, the controller device 102 may receive the historical data from the RF generator 104. In some embodiments, the controller device 102 may receive the historical data from another component.

In some embodiments, the controller device 102 (and/or other component) may determine the historical data by collection of feedback from the DUT 106. In some embodiments, the feedback may be feedback at multiple instances of time. In a non-limiting example, the feedback for each instance of time may indicate a configuration (such as a transmit configuration, receive configuration and/or other configuration) of the DUT 106 at the instance of time.

In some embodiments, the historical data may be related to configurations of the DUT 106, such as transmit configurations, receive configurations and/or other configurations. In some embodiments, the historical data may be related to a sequence of configurations (transmit configurations, receive configurations and/or other configurations) of the DUT 106. In some embodiments, the historical data may be related to a sequence of configurations (transmit configurations, receive configurations and/or other configurations) of the DUT 106 at a sequence of times.

It is understood that references to a transmit configuration, receive configuration and/or other configuration are not limiting. For instance, one or more techniques, operations and/or methods may be described herein in terms of transmit configurations, and it is understood that one or more of those techniques, operations and/or methods may be applicable to embodiments related to receive configurations and/or other configurations.

In some embodiments, the configurations of a plurality of configurations may be different in terms of factors such as angles, polarizations, numbers of beams, beam directions, and/or other.

In some embodiments, the transmit configurations of a plurality of transmit configurations may be different in terms of one or more of: transmit angles, transmit polarizations, numbers of transmit beams, transmit start times, transmit durations, RF modulation types, center frequencies, starting phase angles and/or other.

In some embodiments, the receive configurations of a plurality of receive configurations may be different in terms of one or more of: receive angles, receive polarizations, numbers of receive beams, frequency ranges and/or other.

In some embodiments, the historical data may be related to states of the DUT 106. In some embodiments, the historical data may be related to one or more of: one or more transmit parameters of the DUT 106, one or more receive parameters of the DUT 106, one or more configurations of the DUT that occurred prior to a current configuration of the DUT 106, one or more configurations of the DUT that occurred after the current configuration of the DUT 106, and/or other.

At operation 310, the controller device 102 may generate one or more machine learning rules. In some embodiments, the controller device 102 may generate the one or more machine learning rules based on one or more of: the historical data, other data, one or more parameters and/or other. In a non-limiting example, the historical data may be related to a sequence of configurations (such as transmit configurations, receive configurations and/or other) of the DUT 106 at a sequence of times.

In some embodiments, the controller device 102 may generate the one or more machine learning rules for one or more of: prediction of a future transmit configuration of the DUT 106, prediction of a future receive configuration of the DUT 106, prediction of a future configuration of the DUT 106, prediction of future behavior of the DUT 106, determination of candidate future configurations (such as transmit configurations, receive configurations and/or other configurations) of the DUT 106, and/or other.

In some embodiments, the one or more machine learning rules may be related to assignment of one or more probabilities that the DUT 106 switches from a current configuration to one or more other configurations during a future time period. For instance, the probabilities may be related to switching, by the DUT 106, from the current transmit configuration to one or more other transmit configurations during the future time period.

In some embodiments, probabilities may be assigned to one or more configurations. In a non-limiting example, the assignment of the probabilities may be based on running averages for the transmit configurations (including but not limited to running averages based on how frequently the DUT 106 uses the transmit configurations).

At operation 315, the controller device 102 may receive feedback from the DUT. In some embodiments, the feedback may indicate a current configuration (such as a transmit configuration, receive configuration and/or other configuration) of the DUT 106, although the scope of embodiments is not limited in this respect.

At operation 320, the controller device 102 may apply the one or more machine learning rules. In some embodiments, the controller device 102 may apply the one or more machine learning rules to the current configuration of the DUT 106 to determine one or more elements, such as a set of candidate future configurations of the DUT 106 and/or other element(s). In some embodiments, the controller device 102 may use the one or more machine learning rules, and may use one or more inputs, including but not limited to the current configuration of the DUT 106.

In some embodiments, the controller device 102 may apply the one or more machine learning rules to determine a set of candidate future configurations (such as transmit configurations, receive configurations and/or other configurations) of the DUT 106. In some embodiments, the controller device 102 may apply the one or more machine learning rules to determine a set of candidate future configurations (such as transmit configurations, receive configurations and/or other configurations) of the DUT 106 during a future time period. In some embodiments, the controller device 102 may apply the one or more machine learning rules to a current configuration (such as a transmit configuration, a receive configuration and/or other configuration) of the DUT 106. The current configuration may be received in the feedback of operation 315, although the scope of embodiments is not limited in this respect.

In some embodiments, the candidate future configurations (such as a transmit configuration, a receive configuration and/or other configuration) may be a subset of a larger set of configurations. In a non-limiting example, the DUT 106 may be configurable for the configurations of a master set of possible configurations. The controller device 102 may determine the candidate future configurations of the DUT 106 to be a subset of the master set of possible configurations. In some embodiments, a size of the set of candidate future configurations of the DUT 106 may be configurable to be less than a size of the master set of possible configurations.

In some embodiments, the controller device 102 may determine, based on the one or more machine learning rules, probabilities that the DUT 102 switches from a current configuration (such as a transmit configuration, a receive configuration and/or other configuration) to one or more of other configurations. The controller device 102 may determine the set of candidate future configurations of the DUT 106 to include the configurations for which the corresponding probabilities are greater than a threshold.

At operation 325, the controller device 102 may generate a set of RF waveforms for the set of candidate future configurations of the DUT 106. At operation 330, the controller device 102 may transfer the set of RF waveforms to an RF generator 104.

In some embodiments, the set of RF waveforms may include an RF waveform for each of the candidate future transmit configurations of the DUT 106, although the scope of embodiments is not limited in this respect. In some embodiments, each RF waveform may be based on one or more RF parameters of the corresponding candidate future configuration of the DUT 106.

In some embodiments, the controller device 102 may generate the RF waveforms based on configurable parameters that may include one or more of the following: RF transmit power, transmit polarization, transmit direction, numbers of transmit beams, RF modulation type, waveform start time, waveform duration, waveform center frequency, waveform starting phase, and/or other.

In a non-limiting example, at least some of the transmit configurations of the plurality of transmit configurations may be based on transmission in accordance with different angles. The controller device 102 may generate the RF waveforms in accordance with the corresponding angles of the candidate future transmit configurations.

In another non-limiting example, at least one of the transmit configurations of the plurality of transmit configurations may be based on transmission in accordance with a polarization angle. At least one of the transmit configurations of the plurality of transmit configurations may be based on transmission in accordance with an orthogonal polarization angle. The controller device 102 may generate the RF waveforms in accordance with the corresponding angles of the candidate future transmit configurations.

In another non-limiting example, at least some of the transmit configurations may be based on transmission in accordance with different numbers of transmit beams. The controller device 102 may generate the RF waveforms in accordance with the corresponding numbers of transmit beams of the candidate future transmit configurations.

In another non-limiting example, at least some of the transmit configurations may be based on transmission in accordance with different frequency ranges. The controller device 102 may generate the RF waveforms in accordance with the frequency range of the candidate future transmit configurations.

In some embodiments, the controller device 102 may transfer the set of RF waveforms to the RF generator 104 to enable the RF generator 104 to transfer one of the RF waveforms to the DUT 106 during a future time period in response to a switch of configurations (transmit configurations, receive configurations and/or other configurations) by the DUT 106. In a non-limiting example, the controller device 102 may transfer the set of RF waveforms to the RF generator 104 to enable switching of a signal (such as a source signal, interference signal and/or other signal) in less than 50 nano-seconds (nsec). Embodiments are not limited to the example number of 50 nsec, as other values may be used in some embodiments.

In some embodiments, the controller device 102 may generate one or more machine learning rules for prediction of a future configuration of a DUT 106. The controller device 102 may generate the one or more machine learning rules based on one or more of: historical data related to a sequence of receive configurations of the DUT 106 at a sequence of times, other data related to the DUT 106 (such as configurations, states and/or other), and/or other. The controller device 102 may receive, from the DUT 106, feedback that indicates a current receive configuration of the DUT 106. The controller device 102 may apply the one or more machine learning rules to the current receive configuration of the DUT 106 to determine a set of candidate future receive configurations of the DUT 106 during a future time period. The controller device 102 may generate a set of RF waveforms for testing of the DUT 106. The set of RF waveforms may include an RF waveform for each of the candidate future receive configurations of the DUT 106. The controller device 102 may transfer the set of RF waveforms to the RF generator 104.

In some embodiments, the controller device 102 may receive, from the DUT 106, feedback that indicates configurations of the DUT 106 at different times. The configurations may be included in a master set of possible configurations. The controller device 102 may generate, based on the feedback, one or more machine learning rules to predict a future configuration of the DUT 106 based on a current configuration of the DUT 106. The controller device 102 may receive, from the DUT 106, an indicator of the current configuration. The controller device 102 may select, based on the one or more machine learning rules, a subset of configurations from the master set of possible configurations. The controller device may select the subset of configurations based on probabilities of the DUT 106 switching from the current configuration to each of the configurations of the subset. The controller device 102 may, for each of the configurations of the subset, generate an RF waveform to be used by the RF generator 104 to provide a source signal to the DUT 106 or an interference signal to the DUT 106. The controller device 102 may generate each of the RF waveforms based on an RF parameter of the corresponding configuration. The controller device 102 may transfer the RF waveforms to the RF generator 104.

Figure 4:
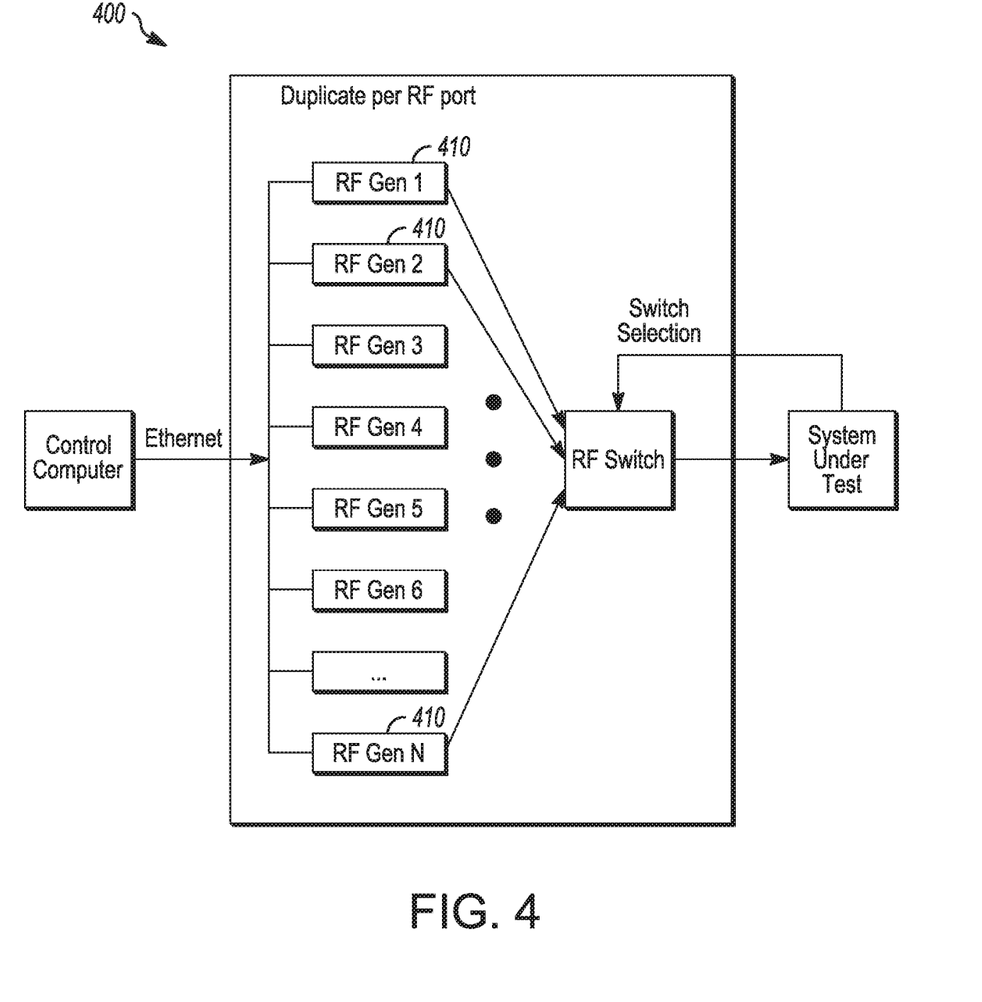
FIG. 4 illustrates an example test environment in accordance with some embodiments.
Figure 5:
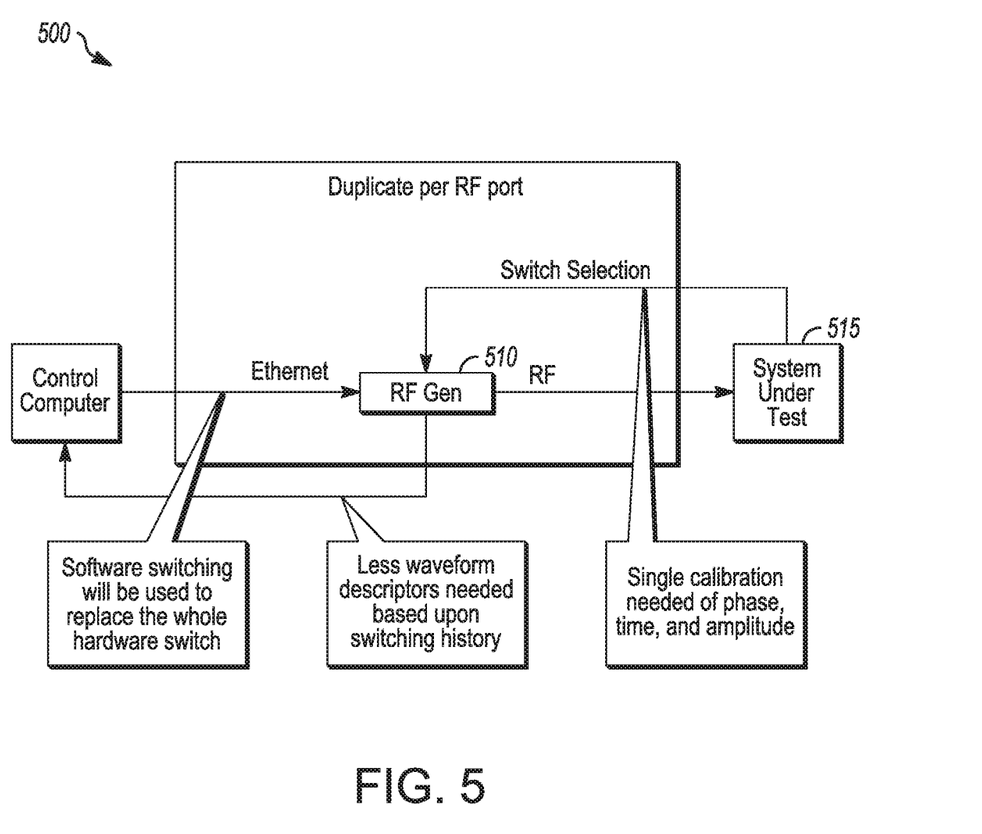
FIG. 5 illustrates an example test environment in accordance with some embodiments.
Figure 6:
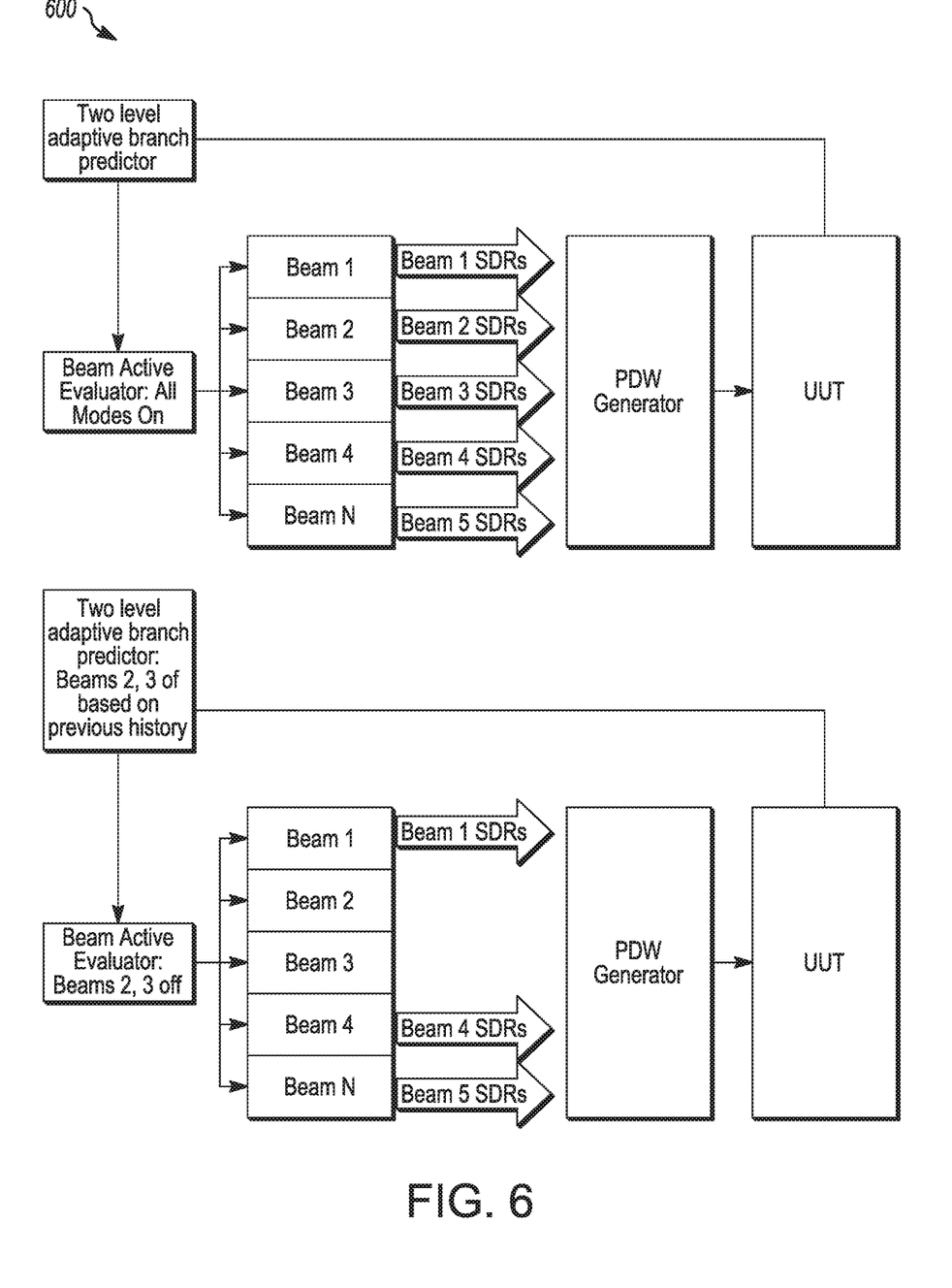
FIG. 6 illustrates an example algorithm in accordance with some embodiments.
Figure 7:
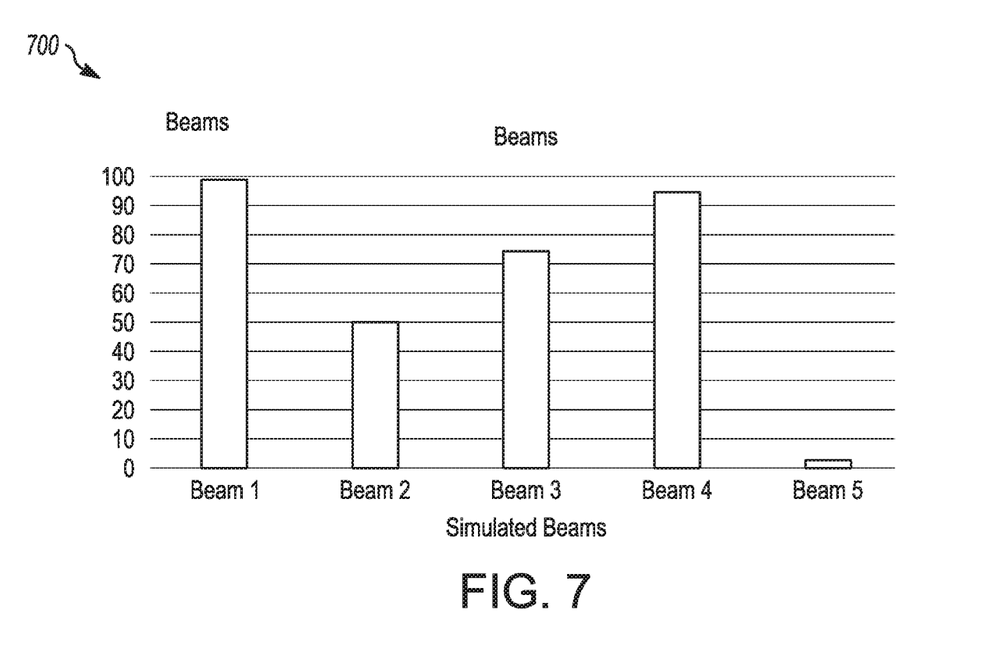
FIG. 7 illustrates an example algorithm in accordance with some embodiments.

FIG. 4 illustrates an example test environment in accordance with some embodiments. FIG. 5 illustrates an example test environment in accordance with some embodiments. FIG. 6 illustrates an example algorithm in accordance with some embodiments. FIG. 7 illustrates an example algorithm in accordance with some embodiments. It should be noted that the examples shown in FIGS. 4-7 may illustrate some or all of the concepts and techniques described herein in some cases, but embodiments are not limited by the examples. For instance, embodiments are not limited by the name, number, type, size, ordering, arrangement of elements (such as devices, operations, messages and/or other elements) shown in FIGS. 4-7.

Some embodiments may not necessarily include all operations shown in FIGS. 4-7. For instance, the controller device 102 may perform one or more operations shown in FIG. 6, but may not necessarily perform all of those operations, in some embodiments. In some embodiments, the telemetry device 102 may perform one or more additional operations not shown in FIG. 6. For instance, the controller device 102 may perform one or more operations shown in FIG. 6, and one or more additional operations. In some embodiments, the controller device 102 may perform one or more operations that are similar to one or more operations shown in FIGS. 4-7.

Referring to FIG. 4, a hardware-based architecture 400 for selecting RF waveforms is shown. It should be noted that a number of RF generators are used in this solution 400. That number may be large, in some cases.

Referring to FIG. 5, in the architecture 500, software may stream RF waveforms to the RF generator 510. Firmware of the RF generator 510 may select a waveform buffer based upon a switch selection. Non-active buffers may clear out expired waveform data. The control device 505 may learn switch behavior of the DUT 515, and may generate RF waveforms that have a high probability of being active.

In comparison to the architecture 400, in some cases, one or more of the following benefits may be realized by the architecture 500: a reduced amount of hardware (such as one RF generator 510 in comparison to multiple RF generators 410); a simpler RF calibration; fewer RF parts (which may provide better signal-to-noise ratio); reduction in an amount of pattern generations through learning; and/or other(s).

In some embodiments, in an RF test environment, RF pattern/waveform generation may be changed based on a signal from the DUT 106 (which may be in a nano-second scale, although the scope of embodiments is not limited in this respect). In some cases, one or more of the following and/or similar may be applicable (although the scope of embodiments is not limited as such): the number of RF patterns/waveforms may be known, an RF pattern/waveform to be used may only be known shortly before it is needed (which may be in a milli-second scale, although the scope of embodiments is not limited in this respect); an RF switching sequence (such as a pattern of configurations/states) may not necessarily be known; and/or other. Aspects such as polarization and/or others may be changed by the DUT 106. In a non-limiting example, in a closed-loop RF radar simulation for electronic warfare testing, the DUT 106 may switch its selected antenna polarization.

In some embodiments, an architecture may provide closed-loop control (in the nano-second range or otherwise) of an RF environment between a DUT 106 and one or more RF generators 104. In some cases, complex waveforms may be created using a minimum amount of hardware and/or a reduced amount of hardware.

In some embodiments, one or more algorithms (such as artificial intelligence (AI) algorithms and/or machine learning algorithms) may be used. In some embodiments, such algorithms may increase a test RF waveform density (after a first run or otherwise) by learning RF switching patterns and/or other patterns. Upcoming possible waveforms may be streamed (by software and/or other) to the RF generator 104 based on the closed-loop feedback from the DUT 106. In some embodiments, each of the RF waveforms that is streamed to the RF generator 104 may be tagged with an ID.

In some embodiments, one or more of the following may be used: two-level adaptive predication, correlation-based branch prediction, and/or other. In some embodiments, a pattern history table (which may be similar to historical data described herein, although the scope of embodiments is not limited in this respect) may be generated. Such a table may enable prediction based on a current state/configuration and past results (such as states, configurations, and/or other).

In some embodiments, a correlation limit may be established, and only predictions that exceed the correlation limit will be used (selected, sent to the RF generator 104, etc.). In some cases, a more aggressive correlation limit may lead to more prediction mistakes but patterns may be found more quickly. In some cases, a running average of previous occurrences may be used, and probabilities may be generated based on that average. In some cases, if the prediction turns out to be wrong, then the RF may still be generated in real time so that the system behaves correctly.

A non-limiting example 700 is shown in FIG. 7. If a correlation limit of 90% is used, only beams #1 and #4 would be used. Prediction may be used to determine whether or not beam SDRs are to be generated.

In some embodiments, different types of switch history analysis may be used. In a non-limiting example, a linear technique may be used. A next time may be subtracted from a previous time in the switch history. If the result is consistent throughout the history within a certain error range, then a linear interpolation can be used.

In another non-limiting example, Fourier analysis may be used. A periodicity of the switch history may be determined using Fourier analysis, Fast Fourier analysis and/or other.

In another non-limiting example, regression analysis (including but not limited to Poisson regression) may be used. In some cases, such a technique may be used to make predictions for linear data with a broader distribution, although the scope of embodiments is not limited in this respect.

The Abstract is provided to comply with 37 C.F.R. Section 1.72(b) requiring an abstract that will allow the reader to ascertain the nature and gist of the technical disclosure. It is submitted with the understanding that it will not be used to limit or interpret the scope or meaning of the claims. The following claims are hereby incorporated into the detailed description, with each claim standing on its own as a separate embodiment.

What is claimed is:

1. A controller device to perform control functionality for a system that includes a radio frequency (RF) generator and a device under test (DUT), the RF generator configured to provide a source signal to the DUT, the DUT configurable to switch between receive configurations of a plurality of receive configurations, the controller device comprising: memory; and processing circuitry, configured to:
generate a machine learning rule for prediction of future receive configurations of the DUT, the machine learning rule generated based on historical data related to a sequence of receive configurations of the DUT at a sequence of times;
receive, from the DUT, feedback that indicates a current receive configuration of the DUT;
apply the machine learning rule to the current receive configuration of the DUT to determine a set of candidate future receive configurations of the DUT during a future time period;
generate a set of RF waveforms that includes an RF waveform for each of the candidate future receive configurations of the DUT based on one or more RF parameters of the corresponding candidate future receive configuration of the DUT; and
transfer the set of RF waveforms to the RF generator.

2. The controller device according to claim 1, the processing circuitry further configured to transfer the set of RF waveforms to the RF generator to enable the RF generator to transfer one of the RF waveforms to the DUT during the future time period in response to a switch of transmit configurations by the DUT.

3. The controller device according to claim 1, wherein:
the plurality of receive configurations is a master set of possible receive configurations,
the processing circuitry is further configured to determine the set of candidate future receive configurations of the DUT to be a subset of the master set of possible receive configurations,
wherein a size of the set of candidate future receive configurations of the DUT is configurable to be less than a size of the master set of possible receive configurations.

4. The controller device according to claim 1, wherein:
at least some of the receive configurations of the plurality of receive configurations are based on reception in accordance with different angles, and
the processing circuitry is configured to receive the RF waveforms in accordance with the corresponding angles of the candidate future transmit configurations.

5. The controller device according to claim 1, wherein:
at least one of the receive configurations of the plurality of transmit receive configurations is based on reception in accordance with an antenna polarization angle,
at least one of the reception configurations of the plurality of transmit receive configurations is based on reception in accordance with an orthogonal polarization, and
the processing circuitry is configured to generate the RF waveforms in accordance with the corresponding polarization of the candidate future receive configurations.

6. The controller device according to claim 1, wherein:
at least some of the receive configurations are based on reception in accordance with different numbers of receive beams, and
the processing circuitry is configured to receive the RF waveforms in accordance with the corresponding numbers of receive beams of the candidate future receive configurations.

7. The controller device according to claim 1, wherein the receive configurations of the plurality of receive configurations are different in terms of one or more of:
receive angles,
receive polarization, and
numbers of receive beams.

8. The controller device according to claim 1, the processing circuitry further configured to:
generate the machine learning rule to include assignment of one or more probabilities that the DUT switches from the current receive configuration to one or more other receive configurations during the future time period.

9. The controller device according to claim 8, the processing circuitry further configured to:
determine, based on the machine learning rule, probabilities that the DUT switches from the current transmit configuration to one or more of the other receive configurations; and
determine the set of candidate future receive configurations of the DUT to include the receive configurations for which the corresponding probabilities are greater than a threshold.

10. The controller device according to claim 8, wherein the assignment of the probabilities to the receive configurations is based on running averages for the receive configurations, the running averages based on how frequently the DUT uses the receive configurations.

11. The controller device according to claim 1, the processing circuitry further configured to:
receive the historical data from the DUT or from the RF generator.

12. The controller device according to claim 1, the processing circuitry further configured to:
determine the historical data by collection of feedback from the DUT at multiple instances of time, wherein the feedback for each instance of time indicates the transmit configuration of the DUT at the instance of time.

13. The controller device according to claim 1, the processing circuitry configured to transfer the set of RF waveforms to the RF generator to enable switching of the source signal in less than 50 nano-seconds (ns).

14. The controller device according to claim 1, wherein at least some of the candidate future receive configurations are based on different frequency ranges.

15. A method, comprising:
generating a machine learning rule for prediction of a future configuration of a device under test (DUT), the machine learning rule generated based on historical data related to a sequence of receive configurations of the DUT at a sequence of times;
receiving, from the DUT, feedback that indicates a current receive configuration of the DUT;
applying the machine learning rule to the current receive configuration of the DUT to determine a set of candidate future receive configurations of the DUT during a future time period;
generating a set of radio frequency (RF) waveforms for testing of the DUT, wherein the set of RF waveforms includes an RF waveform for each of the candidate future receive configurations of the DUT; and
transferring the set of RF waveforms to the RF generator.

16. The method according to claim 15, further comprising:
generating each of the RF waveforms based on configurable parameters that include one or more of:
RF power,
transmit polarization,
transmit direction,
numbers of transmit beams,
transmit start time,
transmit duration,
RF modulation type,
Waveform center frequency, and
Starting phase angle.

17. The method according to claim 15, wherein the receive configurations of the plurality of receive configurations are different in terms of one or more of:
receive angles,
receive polarization,
frequency ranges, and
numbers of receive beams.

18. A non-transitory computer-readable storage medium that stores instructions for execution by processing circuitry to perform operations for a controller device, the operations to configure the processing circuitry to:
receive, from a device under test (DUT), feedback that indicates configurations of the DUT at different times, the configurations included in a master set of possible configurations;
generate, based on the feedback, a machine learning rule to predict a future configuration of the DUT based on a current configuration of the DUT;
receive, from the DUT, an indicator of the current configuration;
select, based on the machine learning rule, a subset of configurations from the master set of possible configurations,
wherein the subset of configurations is selected based on probabilities of the DUT switching from the current configuration to each of the configurations of the subset;
for each of the configurations of the subset, generate a radio frequency (RF) waveform to be used by an RF generator to provide a source signal to the DUT or an interference signal to the DUT,
wherein each of the RF waveforms is generated based on an RF parameter of the corresponding configuration; and
transfer the RF waveforms to the RF generator.

19. The non-transitory computer-readable storage medium according to claim 18, the operations to configure the processing circuitry to transfer the RF waveforms to the RF generator to enable switching of the source signal or interference signal in less than 50 nano-seconds (ns).

* * * * *

UNITED STATES PATENT AND TRADEMARK OFFICE
CERTIFICATE OF CORRECTION

PATENT NO. : 10,749,618 B1  
APPLICATION NO. : 16/660325  
DATED : August 18, 2020  
INVENTOR(S) : Vahey et al.

Page 1 of 1

It is certified that error appears in the above-identified patent and that said Letters Patent is hereby corrected as shown below:

In the Specification

In Column 2, Line 54, delete "119." and insert --106.-- therefor

In Column 9, Line 42, delete "102" and insert --106-- therefor

Signed and Sealed this  
Twenty-sixth Day of January, 2021

Drew Hirshfeld  
*Performing the Functions and Duties of the*  
*Under Secretary of Commerce for Intellectual Property and*  
*Director of the United States Patent and Trademark Office*